United States Patent [19]
Sisson et al.

[11] Patent Number: 5,734,259
[45] Date of Patent: Mar. 31, 1998

[54] BALANCED DELTA CURRENT METHOD FOR CURRENT CONTROL IN A HYSTERETIC POWER SUPPLY

[75] Inventors: Paul Sisson, Exeter, R.I.; Gedaly Levin, Acton, Mass.

[73] Assignee: Cherry Semiconductor Corporation, East Greenwich, R.I.

[21] Appl. No.: 719,031

[22] Filed: Sep. 24, 1996

Related U.S. Application Data

[60] Provisional application No. 60/004,605, Sep. 29, 1995.
[51] Int. Cl.$^6$ ............................................. G05F 1/56
[52] U.S. Cl. ................................................ 323/282
[58] Field of Search ............................ 323/282, 283, 323/284, 285, 222, 286; 361/18

[56] References Cited

U.S. PATENT DOCUMENTS

| | | | |
|---|---|---|---|
| 3,294,981 | 12/1966 | Bose | 307/88.5 |
| 3,978,393 | 8/1976 | Wisner et al. | 323/17 |
| 4,127,885 | 11/1978 | Adam et al. | 361/18 |
| 4,456,872 | 6/1984 | Froeschle | 323/286 |
| 4,761,722 | 8/1988 | Pruitt | 363/17 |
| 4,916,381 | 4/1990 | Gelecinskyj et al. | 323/285 |
| 4,959,606 | 9/1990 | Forge | 323/286 |
| 5,345,165 | 9/1994 | Froeschle | 323/284 |

*Primary Examiner*—Adolf Berhane
*Attorney, Agent, or Firm*—Bromberg & Sunstein LLP

[57] ABSTRACT

A switching voltage controller with improved rejection of supply voltage transients, wherein the switching of the voltage controller is controlled by sensing the current through an inductor to provide a current sense signal proportional to the sensed current and comparing the current sense signal voltage to the voltage of a peak signal and the voltage of a valley signal. An error amplifier provides a control signal proportional to the voltage difference between the output voltage of the voltage controller and a reference voltage source. The switching voltage controller provides for improved rejection of transients in the supply voltage by forcing the valley signal to be a first voltage differential $\Delta'$ volts below the control signal and the peak signal to be a second voltage differential $\Delta''$ volts above the control signal, where $\Delta''$ and $\Delta'$ are functions of the supply voltage to the voltage controller such that the rate of change of $\Delta''$ and $\Delta'$ with respect to the supply voltage are substantially equal to each other.

19 Claims, 6 Drawing Sheets

BALANCED DELTA CURRENT METHOD FOR CURRENT CONTROL IN A HYSTERETIC POWER SUPPLY

This application claims the benefit of U.S. Provisional Application No. 60/004,605, filed 29 Sep. 1995.

FIELD OF THE INVENTION

This invention relates to a hysteretic switching power supply, or voltage converter, with improved rejection of transients in the supply voltage.

BACKGROUND OF THE INVENTION

Switching power supplies, or voltage converters, regulate their output voltage by energizing a storage element, such as an inductor, at some given switching frequency and duty cycle. A hysteretic power supply is a switching power supply in which the switching frequency and duty cycle are determined by a hysteretic-type sequential switching circuit with two states.

General principles in hysteretic switching are taught in U.S. Pat. No. 3,294,981 (Bose) which is incorporated herein by reference. An improvement of the invention disclosed in U.S. Pat. No. 3,294,981 in which current sensing is employed is taught in U.S. Pat. No. 4,456,872 (Froeschle), which is incorporated herein by reference. The present invention has improved supply line transient rejection, while still maintaining switching frequency stability.

FIG. 1 serves to illustrate a prior art hysteretic power supply, or voltage converter, with frequency stabilization against supply voltage transients. The voltage converter of FIG. 1 is powered by supply 5 with supply voltage $V_{ss}$ (perhaps unregulated) and has a regulated output voltage $V_O$ at output terminal 10. Switch 15 is switched ON and OFF at some switching frequency f and duty cycle D. In FIG. 1, switch 15 is a p-channel MOSFET with substrate tied to voltage $V_{ss}$. When switch 15 is switched ON, current flow increases in inductor 20 and its magnetic energy increases, whereas when switch 15 is OFF, current flow decreases in inductor 15 and its magnetic energy decreases. Diode 25 is reverse-biased when switch 15 is ON, and when switch 15 is OFF, diode 25 is forward biased, allowing current to flow through inductor 20. If the switching frequency of switch 15 is sufficiently high, the current through inductor 20 will have a relatively constant average, and the output voltage will be given by $V_O = DV_{ss}$. Capacitor 30 is an output voltage storage element to reduce voltage ripple and provide some immunity to load transients.

The mechanism by which switch 15 is switched ON and OFF will now be discussed. Resistor 35 is a low resistance sense resistor coupled to inputs 40 and 45 of current sense amplifier 50. The output voltage of amplifier 50 is therefore proportional to the current flowing through resistor 35. The output of amplifier 50 is coupled to the non-inverting input of comparator 55 and the inverting input of comparator 60. The output signal of amplifier 50 will be referred to as the current sense signal.

The inverting input of error amplifier 65 is coupled to the output terminal 10. A reference voltage $V_{ref}$ is supplied to the non-inverting input of error amplifier 65. The output of error amplifier 65 is coupled to the inverting input of comparator 55 and is coupled to the non-inverting input of comparator 60 via resistor 73. A voltage divider comprising resistors 70 and 75 supplies a voltage to voltage-controlled current sink 80. The current I of current sink 80 is proportional to voltage $V_{ss}$. Resistor 73 and current sink 80 bring the voltage at node 83 to IR volts below the output voltage of error amplifier 65, where R is the resistance value of resistor 73. The output signal of error amplifier 65 will be referred to as the peak signal and the output signal at node 83 will be referred to as the valley signal. The valley signal is always IR volts below the peak signal. Node 83 is coupled to the non-inverting input of comparator 60.

The outputs of comparators 55 and 60 are respectively coupled to the reset and set terminals of flip-flop 85. The Q-bar terminal of flip-flop 85 is coupled to the gate of p-channel MOSFET switch 15. Flip-flop 85 actually contains additional circuity so that the logical "1" output voltage of the Q-bar terminal is sufficiently high to turn switch 15 OFF. Therefore, line 86 provides a gating signal to MOSFET 15.

To explain the operation of the voltage converter of FIG. 1, consider the case when voltage supply 5 is first coupled to the input of the voltage converter in which inductor 20 and capacitor 30 are initially discharged. The current sense signal will initially be zero, which is below the valley and peak signals, in which case flip-flop 85 will be in a state with Reset=0, Set=1, and Q-bar=0. In this state, the gate of MOSFET switch 15 is low, in which case switch 15 is ON. Because $V_O$ is low, the peak and valley signals will be at there maximum and will stay there until $V_O$ approaches $V_{ref}$. With switch 15 in the ON state for the first time, the current sense signal will increase from zero because the current through inductor 20 will be increasing. When the current sense signal crosses the valley signal for the first time, the state of flip-flop 85 will be in Reset=0, Set=0, and Q-bar=0, so that switch 15 is still ON. However, when the current sense signal crosses above the peak signal, flip-flop 85 will be in the state Reset=1, Set=0, and Q-bar=1, in which case switch 15 is OFF. With switch 15 now OFF, the current sense signal will begin to decline. When the current sense signal falls below the peak signal, the flip-flop state will be Reset=0, Set=0, and Q-bar=1, in which case switch 15 is still OFF. Of course, when $V_O$ is close to $V_{ref}$ the excursions of the current sense signal above and below the peak signal will be very small, and may be neglected. As the current sense signal falls, it will eventually fall below the valley signal. When that happens, the flip-flop state will be Reset=0, Set=1, and Q-bar=0, and switch 15 will now be ON. Thus, the current sense signal rises again, and the cycle continues with switch 15 cycling ON and OFF. The excursions of the current sense signal below and above the valley signal can also be neglected.

If the switching frequency is high enough, then $V_O$ is held nearly constant and the switching frequency f is given by $f = (\alpha R_s V_O / L\Delta)[1-D]$ where $\alpha$ is the voltage gain of current sense amplifier 50, $R_s$ is the resistance value of current sense resistor 35, L is the inductance of inductor 20, and $\Delta$ is the voltage difference between the peak and valley signals. Also, denoting the voltage gain of error amplifier 65 by A, it can be shown that $V_O = V_{ref}$ if $\Delta << AV_{ref}$ and $\alpha R_s << AR_L$ where $R_L$ is the load resistance. The voltage difference $\Delta$ is simply given by the product IR.

If $V_O$ and $V_{ss}$ are not time varying, then the peak, valley, and current sense signals are as illustrated in FIG. 2. The current sense signal oscillates between two thresholds, the peak and valley signals, and switch 15 is ON when the current sense signal is rising and is OFF when the current sense signal is falling. A graph of the output Q-bar of flip-flop 85 as a function of current sense signal is shown in FIG. 3, which illustrates the "hysteretic" nature of the circuit of FIG. 1.

In many power supply applications, it is desirable or necessary to stabilize, or desensitize, the switching frequency f to changes in the supply voltage $V_{ss}$. The stability of switching frequency f is improved if $\Delta$ increases as the supply voltage $V_{ss}$ increases. That is, if $\Delta$ is considered a function in which $V_{ss}$ is one of its dependent variables, then the stability of f is improved if $\Delta$ is an increasing function in the variable $V_{ss}$. To see this, it is useful to write the above expression for f as $f=(\alpha R_s V_0/L)[1-V_{ref}/V_{ss}]/\Delta$. Note that the term $[1-V_{ref}/V_{ss}]$ is a strictly increasing function in $V_{ss}$ for $V_{ss} \geq V_{ref}$, and that therefore f will change as a function of $V_{ss}$ if $\Delta$ were held constant. However, the fractional change in f due to changes in $V_{ss}$ will be reduced if $\Delta$ is an increasing function in supply voltage. In the hysteretic power supply of FIG. 1, because of voltage divider 70 and 75, and voltage controlled current sink 80, $\Delta$ is an increasing function of $V_{ss}$.

Although the dependence of $\Delta$ upon $V_{ss}$ helps to maintain a constant frequency, it introduces a disadvantage to the prior art. Because the valley signal is $\Delta$ volts below the peak signal and the error amplifier 65 is in most cases heavily compensated for feed-back control loop stability, a sudden change in $V_{ss}$ will cause a sudden change in the valley signal, but the peak signal will be relatively slow to respond. This may lead to the situation depicted in FIG. 4, in which there is a sudden drop in supply voltage $V_{ss}$ at time t'. This transient in the supply voltage $V_{ss}$ will cause a decrease in $\Delta$ and a sudden rise in the valley signal. In FIG. 4, we let $\Delta_-$ denote $\Delta$ before the transient and $\Delta_+$ denote $\Delta$ after the transient, where $\Delta_+ < \Delta$. At time t', the error amplifier has not yet adjusted the peak signal, and consequently the average of the current sense signal, which is midway between the peak and valley signals, also undergoes a transient at time t'. This transient in the average of the current sense signal is undesirable because for constant loads the output voltage $V_O$ will also undergo a transient. After a period of time, the error amplifier will correct the peak valley signal so as to maintain the average of the current sense signal equal to its value before the transient in supply voltage.

Therefore, we see that although the prior art hysteretic power supply of FIG. 1 stabilizes, or desensitizes, the switching frequency to transients in the supply voltage, it suffers from poor supply voltage transient rejection. The present invention, however, provides for superior supply voltage transient rejection while still maintaining the switching frequency stability of the prior art.

SUMMARY OF THE INVENTION

The present invention relates to a method of controlling current in a hysteretic power supply, or hysteretic switching voltage converter (or controller), which has improved supply voltage transient rejection while maintaining switching frequency stability.

The present invention relates to a method of controlling current in a switching voltage converter or controller in which current flowing through a storage element is sensed, and one or more switches are switched ON to energize the storage element when the current flowing through the storage element is less than a first threshold, where the first threshold is $\Delta'$ below a control threshold. The control threshold is indicative of the voltage difference between the output of the switching voltage converter and a reference voltage source, wherein $\Delta'$ is functionally dependent upon the voltage of a supply voltage source coupled to the switching voltage converter. One or more switches are switched OFF when the current flowing through the storage element is greater than a second threshold, where the second threshold is $\Delta''$ above the control threshold, where $\Delta''$ is functionally dependent upon the voltage of the supply voltage source and changes in $\Delta'$ and $\Delta''$ for a given change in the supply voltage are substantially equal to each other.

An embodiment of the present invention comprises an inductor, a switch for energizing the inductor, a current sense amplifier for providing a current sense signal proportional to the current through the inductor, an error amplifier for providing a control signal, and a balanced delta current circuit for providing upper and lower thresholds, referred to respectively as the peak and valley signals. A sequential circuit controls the switching of the voltage converter by changing from a first state to a second state when the current sense signal voltage rises above the peak signal voltage and changing from the second state to the first state when the current sense signal voltage falls below the valley signal, where one or more switches are ON when the sequential circuit is in the first state, thereby energizing the inductor, and are OFF when the sequential circuit is in the second state. The error amplifier provides a control signal proportional to the voltage difference between the output voltage of the voltage converter and a reference voltage source. The balanced delta current circuit provides for improved rejection of transients in the supply voltage by forcing the valley signal to be $\Delta'$ volts below the control signal and the peak signal to be $\Delta''$ volts above the control signal, where $\Delta''$ and $\Delta'$ are functions of the supply voltage to the voltage converter such that the rate of change of $\Delta''$ and $\Delta'$ with respect to the supply voltage are substantially equal to each other.

DETAILED DESCRIPTION OF THE EMBODIMENTS

Figure 1:
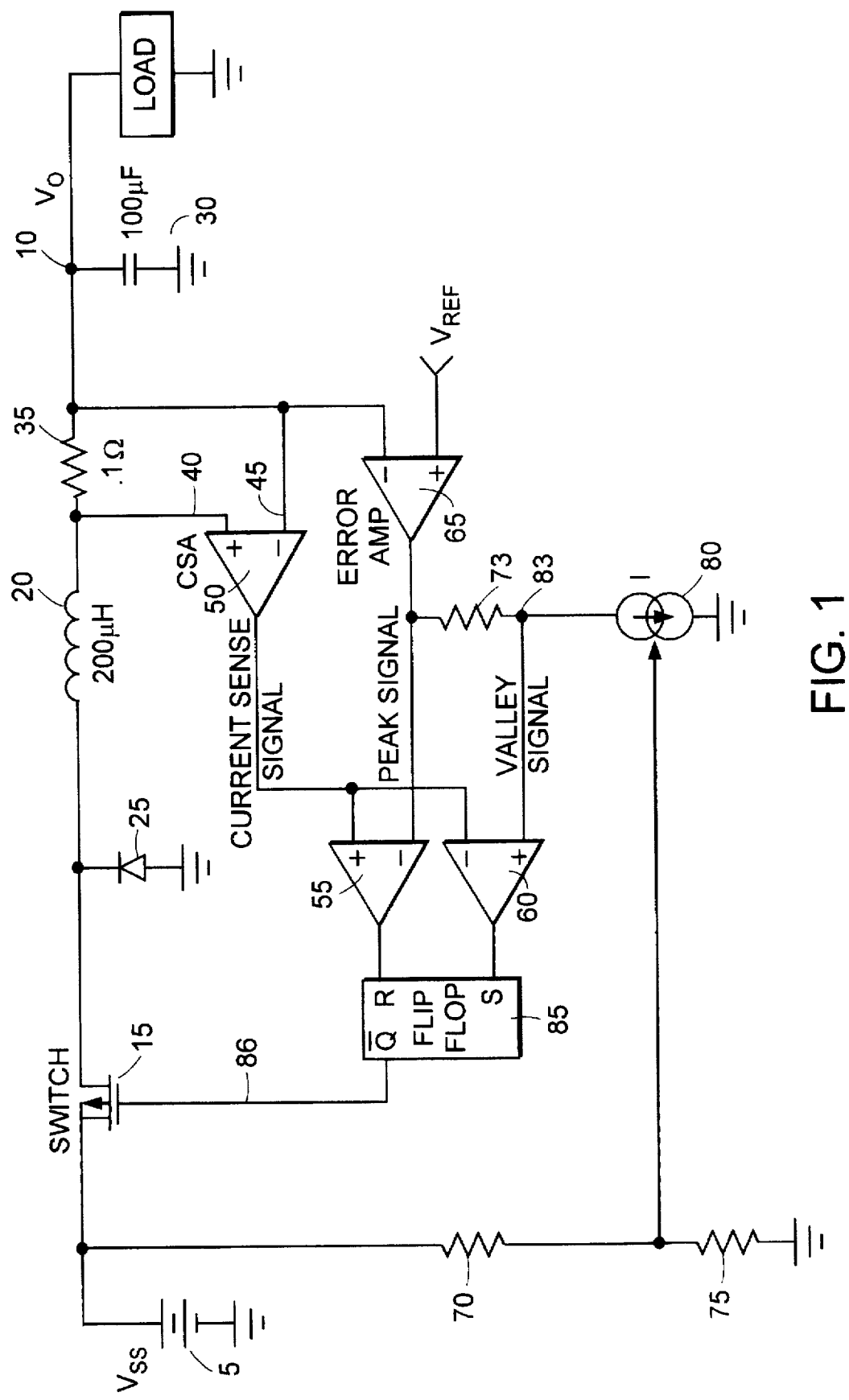
FIG. 1 is a schematic diagram of a prior art hysteretic switching power supply.
Figure 2:
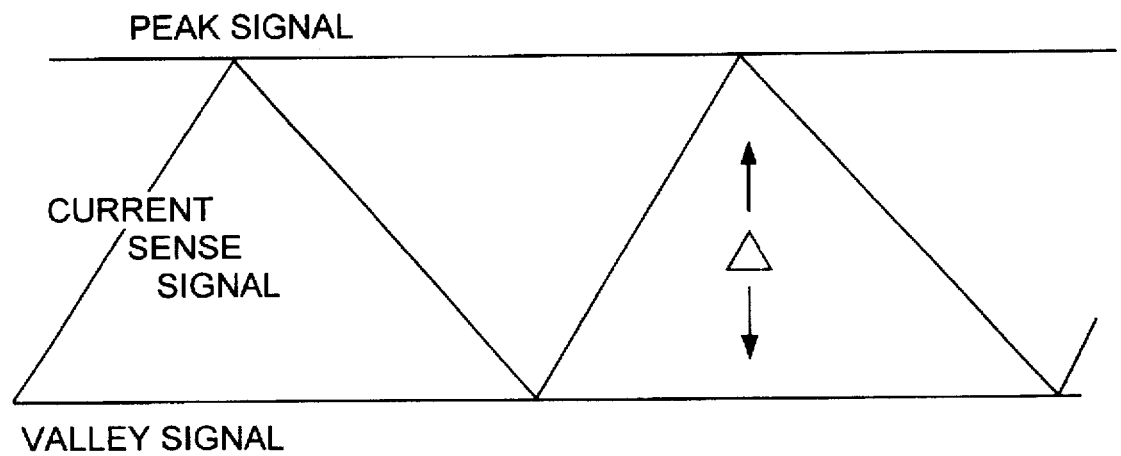
FIG. 2 illustrates conventional oscillation of the current sense signal voltage between the peak and valley signals.
Figure 3:
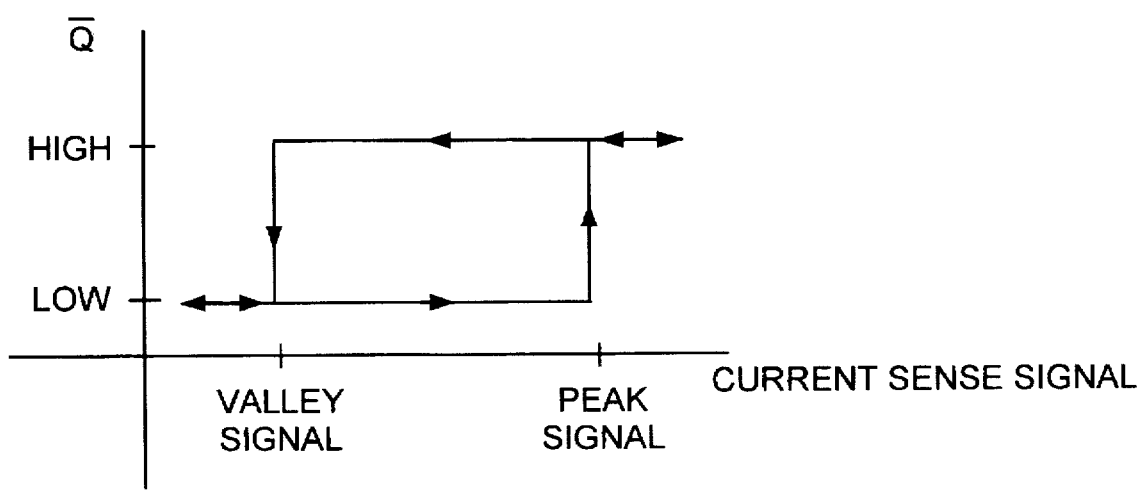
FIG. 3 illustrates the output of a sequential circuit as a function of the current sense signal.
Figure 4:
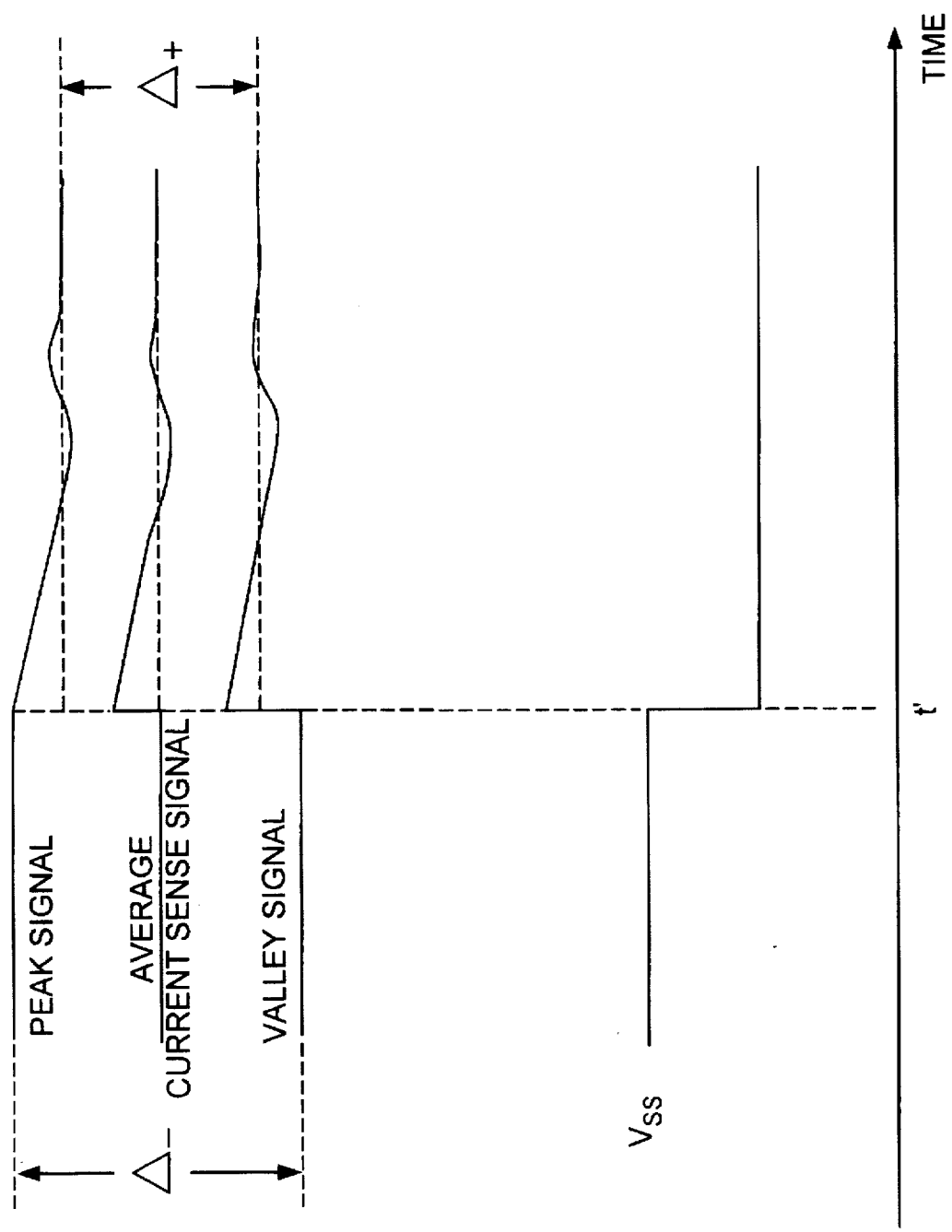
FIG. 4 illustrates supply voltage transient rejection of a prior art hysteretic switching power supply.
Figure 5:
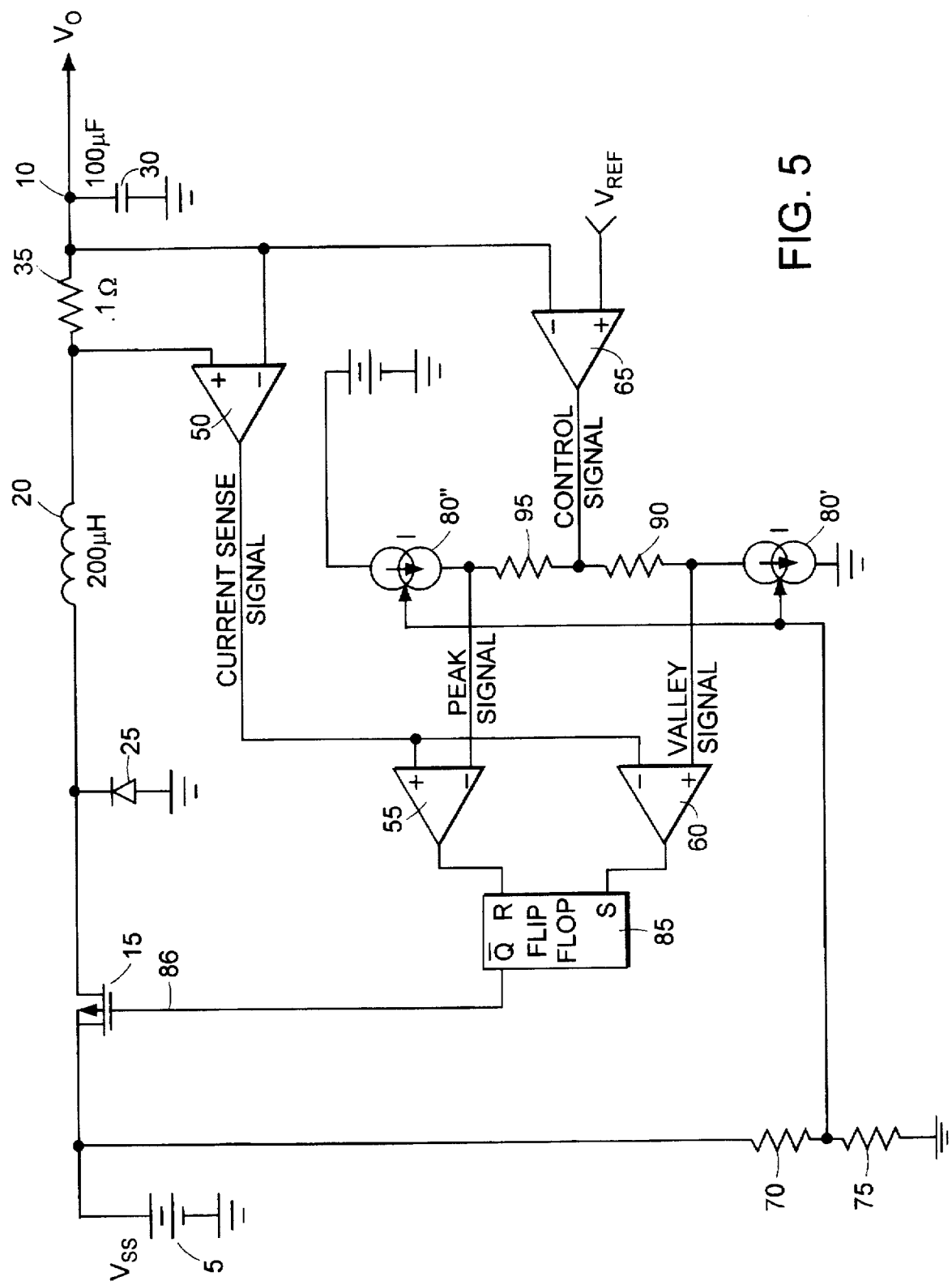
FIG. 5 is a schematic diagram of an embodiment of the present invention.

FIG. 5 is a schematic diagram of an embodiment of the invention. Components in FIG. 5 with corresponding components in FIG. 1 are labeled with the same numerals. In comparing FIG. 5 with the embodiment illustrated in FIG. 1, we see that the main difference is that the peak and valley signals are now derived from the network comprised of resistors 90 and 95, current source 80", and current sink 80'. This network may be described as a balanced delta current circuit. A balanced delta current circuit is defined herein as a circuit that provides two voltage differentials, where one of the voltage differentials is added to a control signal and the other voltage differential is subtracted from the control signal, and where the voltage differentials are functionally dependent upon a voltage (which may be derived from the supply voltage) such that a change in this voltage will cause changes in the voltage differentials, where the change in one voltage differential is substantially equal to the change in the other voltage differential. The balanced delta current circuit can generate the voltage differentials using voltage-controlled current sources and sinks. The output signal of error amplifier 65 provides the control signal.

As in the prior art, the current sense signal will oscillate between the peak and valley signals. However, the valley signal is now at a voltage of $\Delta'=IR'$ below the control signal, where R' is the resistance of resistor 90, and the peak signal is at a voltage $\Delta''=IR''$ above the control signal, where R" is the resistance of resistor 95. In a preferred embodiment, the resistances R' and R" will be of equal value, and current sink 80' and current source 80" will have the same functional dependence upon supply voltage $V_{ss}$, so that $\Delta'$ and $\Delta''$ are "balanced".

For the case of a steady supply voltage $V_{ss}$, the voltage converter of FIG. 5 regulates its output voltage in a similar fashion to that of the prior art. Error amplifier 65 will adjust the control signal output so that the average current sense signal is at a proper value so that $V_O$ is regulated to equal $V_{ref}$. Also, frequency compensation is maintained as in the power supply of FIG. 1 because the voltage difference $\Delta=\Delta'+\Delta''$ between the peak and valley signals is an increasing function in $V_{ss}$. However, unlike the prior art power supply of FIG. 1, the embodiment of FIG. 5 maintains a constant output voltage $V_O$ when the supply voltage $V_{ss}$ has transients.

Figure 6:
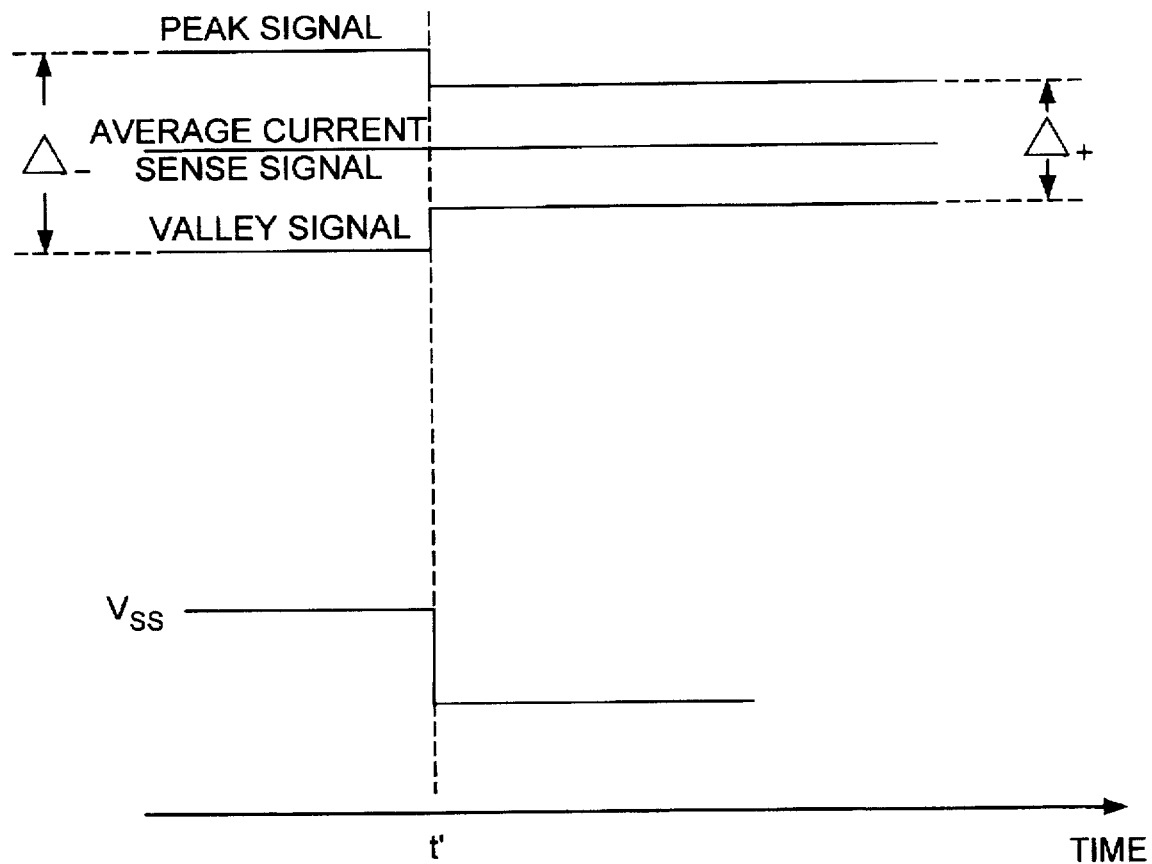
FIG. 6 illustrates the improvement in supply voltage transient rejection of the present invention.

FIG. 6 illustrates the superior supply voltage transient rejection capability of the embodiment of FIG. 5, where we have assumed that R'=R" and the functional dependencies of current source 80" and 80' upon $V_{ss}$ are the same, so that the peak signal is $\Delta/2$ volts above the control signal and the valley signal is $\Delta/2$ volts below the control signal. Given a sudden decrease in $V_{ss}$ at time t', the control signal will remain the same before and after the transient, but the peak signal will decrease and the valley signal will increase by the same amount. Consequently, the average of the current sense signal will not be affected by the transient in $V_{ss}$. Similar results hold for the case in which the transient in $V_{ss}$ is a sudden increase in voltage.

In general, for supply voltage transient rejection according to the present invention, the rate of change of $\Delta'$ with respect to $V_{ss}$ should be substantially equal to the rate of change of $\Delta''$ with respect to $V_{ss}$, or equivalently, the partial derivatives of $\Delta'$ and $\Delta''$ with respect to $V_{ss}$ should be substantially equal to each other. To maintain frequency compensation, these partial derivatives should be positive.

The sub-circuit of FIG. 5 comprising voltage divider 70–75, current sink 80', current source 80", and resistors 90 and 95 is an example of an embodiment of a balanced delta current circuit. Any other embodiment which maintains the valley signal at $\Delta'$ volts below the control signal and the peak signal at $\Delta''$ volts above the control signal in which the functional dependencies of $\Delta'$ and $\Delta''$ upon $V_{ss}$ is such that the rate of change of $\Delta'$ to $V_{ss}$ is substantially equal to the rate of change of $\Delta''$ to $V_{ss}$ may be used without departing from the scope of the present invention. For example, it would be well known to one of ordinary skill in electronics to synthesize the peak and valley signals from voltage amplifiers performing summation and subtraction.

The topology of FIG. 5 is the so-called buck-converter. However, it should be clear to one of ordinary skill in the related art how to modify the circuit of FIG. 5 to that of a boost-converter topology or a buck-boost converter topology. Such topologies are within the scope of the present invention. Furthermore, it is to be noted that the above embodiments can serve as amplifiers for a time-varying $V_{ref}$ provided the switching frequency is greater than the bandwidth of $V_{ref}$. Such amplifier topologies are disclosed in U.S. Pat. No. 3,294,981. Thus, within the scope of the present invention, a switching voltage converter or controller may encompass an amplifier or parts thereof.

Not all of the components illustrated in FIG. 5 are necessarily on one integrated monolithic chip. Inductor 20 and capacitor 30 can be discrete components not residing in an integrated chip. Also, MOSFET 15 may not necessarily be integrated with the other components shown in FIG. 5, in which case output line 86 supplying the gating signal to MOSFET 15 may be coupled to an external pin on a monolithic chip.

Figure 7:
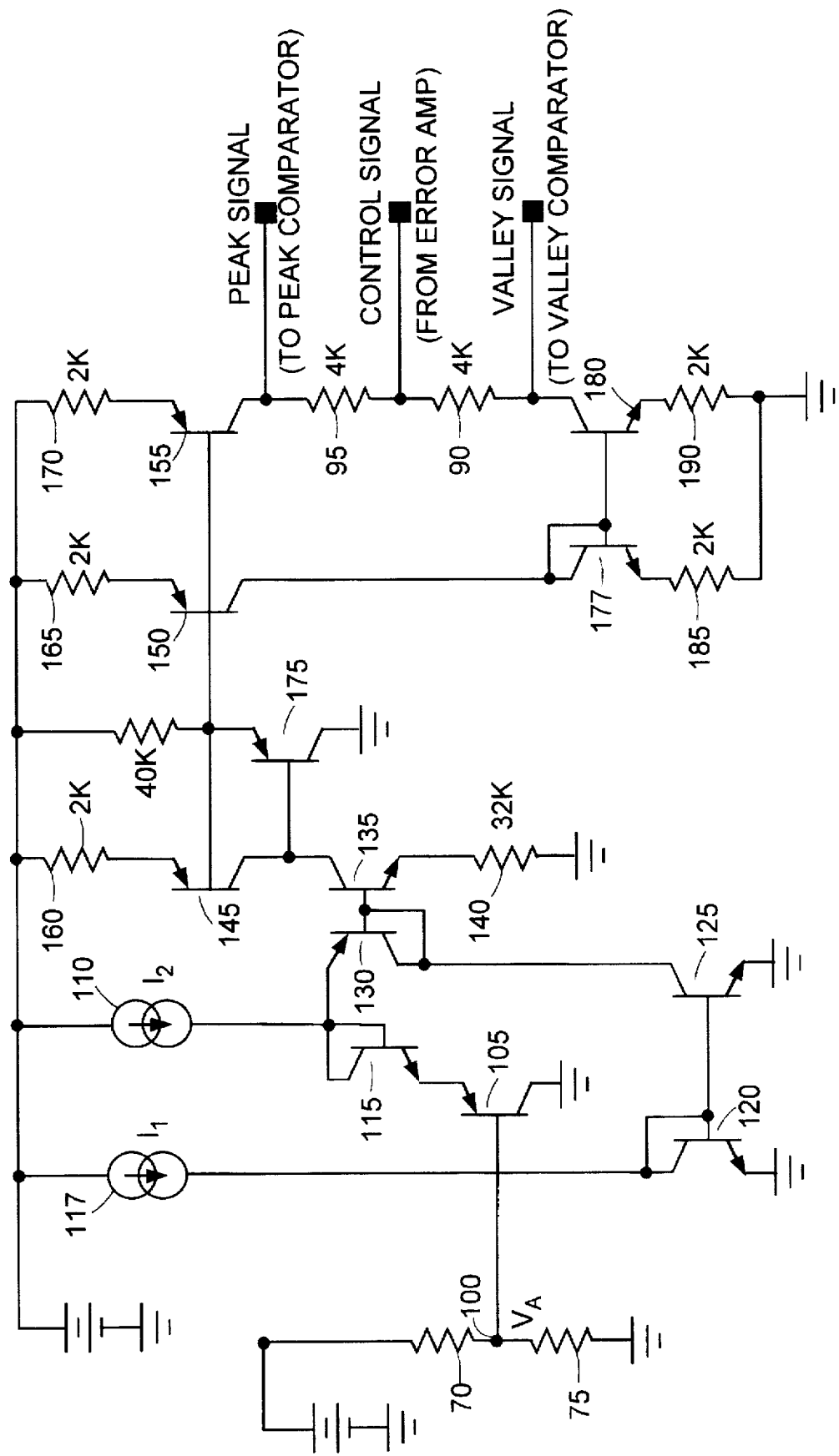
FIG. 7 is a schematic diagram of an embodiment of a balanced delta current circuit.

A more detailed circuit diagram of a balanced delta current circuit is shown in FIG. 7. The voltage at node 100 of voltage divider 70–75 is denoted as $V_A$. Node 100 is coupled to the base of transistor 105 so that its voltage is $V_A$. Current source 110 with current $I_2$ biases the base of transistor 115 to $2V_{BE}+V_A$, where $V_{BE}$ denotes the base-to-emitter voltage drops of transistors 105 and 115. All base-to-emitter voltage drops of the transistors in FIG. 7 may be considered approximately equal to one another. Current source 117 provides current $I_1$ to transistor 120. Transistors 120 and 125 are a matched pair and are configured as a current mirror so that the collector of transistor 125 acts as a current sink for sinking a current of $I_1$. In the embodiment of FIG. 7, $I_2=2I_1=70$ μa, and consequently 35 μa will flow through transistors 115 and 105 as well as through transistor 130. With the emitter of transistor 130 at $2V_{BE}+V_A$, the emitter of transistor 135 will be at $V_A$, and therefore, neglecting base currents, the collector of transistor 135 will sink a current equal to $V_A/R_E$ where $R_E$ is the resistance of emitter resistor 140.

Transistors 145, 150, and 155 are matched and resistors 160, 165, and 170 are equal to each other. The configuration of transistors 145, 150, and 155 is a current mirror in which transistor 175 serves as a buffer for supplying base current to this current mirror. The collectors of transistors 150 and 155 souce a current equal to $V_A/R_E$. Transistors 177 and 180 are matched, and with resistors 185 and 190 having the same resistance, the collector of transistor 180 also sinks a current equal to $V_A/R_E$.

Therefore, the collectors of transistor 155 and 180 source and sink, respectively, a current equal to $V_A/R_E$. With resistors 90 and 95 both having a resistance value of R, the peak signal voltage, identified as the voltage at the collector of transistor 155, and the valley signal voltage, identified as the voltage at the collector of transistor 180, are respectively $RV_A/R_E$ volts above and below the control signal, where the control signal voltage is taken at the common node to resistors 90 and 95. Nominal values for some of the resistors shown in FIG. 7 are listed in the figure. These values are representative, and other values may be used.

It is to be understood that numerous modifications can be made to the embodiments described above without departing from the scope and spirit of the invention.

We claim:

1. A method for controlling current in a switching voltage controller, comprising the steps of:

sensing current flowing through a storage element;

providing a control threshold indicative of the voltage difference between the output of the switching voltage controller and a reference voltage source;

switching a switch ON to energize the storage element when the current flowing through the storage element is sensed to be less than a first threshold, wherein the first threshold is a first voltage differential $\Delta'$ below the control threshold, wherein Δ' is functionally dependent upon the voltage of a supply voltage source coupled to the switching voltage controller; and switching the switch OFF when the current flowing through the storage element is sensed to be greater than a second threshold, wherein the second threshold is a second voltage differential Δ" above the control threshold, wherein Δ" is functionally dependent upon the voltage of the supply voltage source, wherein changes in Δ' and Δ" for a given change in the voltage of the supply voltage source are substantially equal to each other.

2. A method for controlling current in a switching voltage controller with a sequential switching circuit for energizing a storage element by a supply voltage source, comprising the steps of:

sensing current flowing through the storage element to provide a current sense signal indicative of the current;

providing a control signal indicative of the voltage difference between a reference voltage source and the output of the switching voltage controller;

providing a valley signal with a voltage a first voltage differential Δ' below the voltage of the control signal and a peak signal with a voltage a second voltage differential Δ" above the voltage of the control signal, wherein Δ' and Δ" are responsive to the supply voltage source such that changes in Δ' and Δ" for a given change in the voltage of the supply voltage source are substantially equal to each other;

switching the sequential switching circuit to be in a first state when there is a first relationship between the current sense signal voltage and the valley signal voltage; and switching the sequential switching circuit to be in a second state when there is a second relationship between the current sense signal voltage and the peak signal voltage.

3. The method for controlling current in a switching voltage controller as set forth in claim 2, further comprising the steps of:

increasing the stored energy in the storage element when the sequential switching circuit is in the first state; and decreasing the stored energy in the storage element when the sequential switching circuit is in the second state.

4. The method for controlling current in a switching voltage controller as set forth in claim 3, wherein:

the current sense signal voltage is less than the valley signal voltage when the first relationship holds; and the current sense signal voltage is greater than the peak signal voltage when the second relationship holds.

5. The method for controlling current in a switching voltage controller as set forth in claim 2, further comprising the steps of:

decreasing the stored energy in the storage element when the sequential switching circuit is in the first state; and increasing the stored energy in the storage element when the sequential switching circuit is in the second state.

6. The method for controlling current in a switching voltage controller as set forth in claim 5, wherein:

the current sense signal voltage is less than the valley signal voltage when the first relationship holds; and the current sense signal voltage is greater than the peak signal voltage when the second relationship holds.

7. The method for controlling current in a switching voltage controller as set forth in claim 2, further comprising the steps of:

sinking a first current at a first terminal of a first resistor to provide the valley signal, wherein the magnitude of the first current is substantially proportional to the voltage of the supply voltage source according to a first proportionality factor, wherein a second terminal of the first resistor is at the control signal voltage; and sourcing a second current at a first terminal of a second resistor to provide the peak signal, wherein the magnitude of the second current is substantially proportional to the voltage of the supply voltage source according to a second proportionality factor, wherein a second terminal of the second resistor is at the control signal voltage.

8. The method for controlling current in a switching voltage controller as set forth in claim 7, wherein the first proportionality factor is substantially equal to the second proportionality factor, and wherein the resistance of the first resistor is substantially equal to the resistance of the second resistor.

9. The method for controlling current in a switching voltage controller as set forth in claim 7, wherein the magnitude of the first current is substantially equal to the magnitude of the second current.

10. A balanced delta current circuit, comprising:

a first input for a control signal;

a second input responsive to a supply voltage;

a first output to provide a peak signal and a second output to provide a valley signal, wherein the valley signal is at a voltage a first voltage differential Δ' below the voltage at the first input and the peak signal is at a voltage a second voltage differential Δ" above the voltage at the first input such that Δ' and Δ" are functionally dependent upon the voltage at the second input and changes in Δ' and Δ" for a given change in the voltage at the second input are substantially equal to each other.

11. The balanced delta current circuit as set forth in claim 10, further comprising:

a first resistor with a first terminal coupled to the first input;

a current sink coupled to a second terminal of the first resistor, wherein the current sink is coupled the second input and causes a first current to flow through the first resistor where the first current is dependent upon the voltage at the second input;

a second resistor with a first terminal coupled to the first input; and a current source coupled to a second terminal of the second resistor, wherein the current source is coupled to the second input and causes a second current to flow through the second resistor where the second current is dependent upon the voltage at the second input.

12. The balanced delta current circuit as set forth in claim 11, wherein the first and second currents are substantially equal to each other in magnitude and the resistance of the first resistor is substantially equal to the resistance of the second resistor.

13. A switching voltage controller with an output voltage terminal, a supply voltage terminal, and a gating signal terminal, the switching voltage controller comprising:

a balanced delta current circuit, including, a first input for a control signal, where the control signal is responsive to the voltage at the output voltage terminal;

a second input coupled to the supply voltage terminal;

a first output to provide a peak signal and a second output to provide a valley signal, wherein the valley signal is at a voltage a first voltage differential Δ' below the voltage at the first input and the peak signal is at a voltage a second voltage differential Δ" above the voltage at the first input such that Δ' and Δ" are functionally dependent upon the voltage at the second input and changes in Δ' and Δ" for a given change in the voltage at the second input are substantially equal to each other; and a sequential circuit, including,
  a first input coupled to the first output of the balanced delta current circuit;
  a second input coupled to the second output of the balanced delta current circuit;
  a third input responsive to a current sense signal; and
  an output coupled to the gating signal terminal for providing a gating signal, wherein the gating signal is responsive to the state of the sequential circuit, wherein the sequential circuit is in a first state when there is a first relationship between the current sense signal and the peak signal and is in a second state when there is a second relationship between the current sense signal and the valley signal.

14. The switching voltage controller as set forth in claim 13, wherein the balanced delta current circuit further comprises:
  a first resistor with a first terminal coupled to the first input;
  a current sink coupled to a second terminal of the first resistor, wherein the current sink is coupled to the second input and causes a first current to flow through the first resistor where the first current is dependent upon the voltage at the second input;
  a second resistor with a first terminal coupled to the first input; and
  a current source coupled to a second terminal of the second resistor, wherein the current source is coupled to the second input and causes a second current to flow through the second resistor where the second current is dependent upon the voltage at the second input.

15. The balanced delta current circuit as set forth in claim 14, wherein the first and second currents are substantially equal to each other in magnitude and the resistance of the first resistor is substantially equal to the resistance of the second resistor.

16. The switching voltage controller as set forth in claim 14, further comprising:
  a current sense amplifier with an output coupled to the third input of the sequential circuit; and
  an error amplifier responsive to the voltage difference between the output voltage terminal and a reference voltage, and with an output providing the control signal and coupled to the first input of the balanced delta current circuit.

17. A switching voltage controller with a supply voltage input, a reference voltage input, and an output, for regulating the voltage at the output by controlling a current flowing through a switch when an electromagnetic energy storage element is coupled to the switch and the output, the switching voltage controller comprising:
  a switch coupled to the supply voltage input, wherein when a supply voltage source is coupled to the supply voltage input and an electromagnetic energy storage element is coupled to the switch and the output, energy is increasing in the storage element when the switch is ON and is decreasing when the switch is OFF;
  a current sense amplifier coupled to the output, wherein the current sense signal output voltage is indicative of a current flowing through an electromagnetic energy storage element when coupled to the switch and the output;

an error amplifier coupled to the voltage controller output and the reference voltage input, wherein the error amplifier output voltage is indicative of the voltage difference between the voltage controller output and a reference voltage source coupled to the reference voltage input;

a voltage-controlled current sink coupled to the supply voltage input, wherein the current sink is responsive to a supply voltage source coupled to the supply voltage input;

a first resistor with a first terminal coupled to the voltage-controlled current sink and a second terminal coupled to the output of the error amplifier;

a first voltage-controlled current source coupled to the supply voltage input, wherein the first current source is responsive to a supply voltage source coupled to the supply voltage input;

a second resistor with a first terminal coupled to the first current source and a second terminal coupled to the output of the error amplifier; and a sequential circuit coupled to the output of the current sense amplifier, the first terminal of the first resistor, the first terminal of the second resistor, and the switch, wherein the sequential circuit has a first state and a second state; wherein the sequential circuit is in the first state when there is a first relationship between the current sense amplifier output voltage and the voltage at the first terminal of the first resistor and is in the second state when there is a second relationship between the current sense amplifier output voltage and the voltage at the first terminal of the second resistor, wherein the switch changes state when the sequential circuit changes state.

18. The switching voltage controller as set forth in claim 17, further comprising:
  a first transistor with its base coupled to the supply voltage input;
  a second current source coupled to the emitter of the first transistor;
  a second transistor with its base coupled to the second current source and its emitter coupled to a third resistor;
  a first current mirror coupled to the collector of the second transistor for mirroring the collector current of the second transistor, wherein the first current mirror includes a third transistor and a fourth transistor, wherein the collectors of the third and fourth transistors source substantially equal currents; wherein the collector of the fourth transistor is coupled to the first terminal of the second resistor; and
  a second current mirror coupled to the collector of the third transistor and the first terminal of the first resistor for mirroring the collector current of the third transistor to sink current through the first resistor.

19. The switching voltage controller as set forth in claim 18, further comprising:
  a first diode coupled between the emitter of the first transistor and the second current source;
  a second diode coupled between the second current source and the base of the second transistor;
  a third current mirror coupled to the base of the second transistor for sinking current; and
  a third current source coupled to the third current mirror, wherein the third current mirror mirrors the current sourced by the third current source.

* * * * *